United States Patent
Furusawa et al.

(10) Patent No.: US 8,605,768 B2
(45) Date of Patent: Dec. 10, 2013

(54) LASER APPARATUS, DRIVING METHOD OF THE SAME AND OPTICAL TOMOGRAPHIC IMAGING APPARATUS

(75) Inventors: Kentaro Furusawa, Tokyo (JP); Natsuhiko Mizutani, Tokyo (JP); Kazuhide Miyata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 173 days.

(21) Appl. No.: 12/864,574

(22) PCT Filed: May 11, 2009

(86) PCT No.: PCT/JP2009/059102
§ 371 (c)(1), (2), (4) Date: Jul. 26, 2010

(87) PCT Pub. No.: WO2009/139481
PCT Pub. Date: Nov. 19, 2009

(65) Prior Publication Data
US 2011/0155916 A1    Jun. 30, 2011

(30) Foreign Application Priority Data
May 13, 2008  (JP) ................. 2008-125642

(51) Int. Cl.
*H01S 3/083*    (2006.01)
(52) U.S. Cl.
USPC .............. 372/94; 372/6; 372/38.1; 372/38.01
(58) Field of Classification Search
USPC .................................................... 372/6, 94
See application file for complete search history.

(56) References Cited

U.S. PATENT DOCUMENTS

| | | |
|---|---|---|
| 5,592,500 A | 1/1997 | Shirasaki |
| 8,390,818 B2 | 3/2013 | Hirose et al. |
| 2004/0066805 A1* | 4/2004 | Afzal et al. ............ 372/10 |
| 2006/0187537 A1 | 8/2006 | Huber et al. |
| 2008/0089366 A1* | 4/2008 | Liu ....................... 372/6 |
| 2009/0285354 A1 | 11/2009 | Hirose et al. |
| 2010/0321700 A1 | 12/2010 | Hirose et al. |

FOREIGN PATENT DOCUMENTS

| | | |
|---|---|---|
| EP | 0726627 A2 | 8/1996 |
| JP | 8-222790 A | 8/1996 |

OTHER PUBLICATIONS

International Search Report and Written Opinion of the International Searching Authority mailed Oct. 10, 2009 in International Application No. PCT/JP2009/059102, international filed May 11, 2009.

(Continued)

*Primary Examiner* — Yuanda Zhang
(74) *Attorney, Agent, or Firm* — Fitzpatrick, Cella, Harper & Scinto

(57) ABSTRACT

The present invention provides a laser apparatus capable of improving a scan speed and achieving a scan rate equal to or more than 1 MHz, and an optical tomographic imaging apparatus using the laser apparatus as a light source. The laser apparatus includes a ring resonator, the ring resonator having a structure in which a first modulator, a normal dispersion region, a second modulator and an anomalous dispersion region are arranged in this order, and in this arrangement, a gain medium is included, and being configured so that modulation with respect to the second modulator can be caused to be phase modulation by periodically superimposing phase modulation on modulation with respect to the first modulator.

11 Claims, 4 Drawing Sheets

(56) References Cited

OTHER PUBLICATIONS

Nakazawa et al., Direct Generation of a 750fs, 10GHz pulse train from a regeneratively mode-locked fibre laser with multiple harmonic modulation, Electronics Letters, Jul. 4, 1996, vol. 32, No. 14.

Lee et al., Alternate Generation of Tunable Dual-Wavelength Short Pulses from an Actively Mode-Locked Fiber Laser, ECOC '99, Sep. 26-30, 1999, I-82 to I-83.

Shikatani et al., A Study of a Higher Order FM Mode-Locking Laser with Double Phase Modulators, Electronics and Communications in Japan, Part 2, vol. 86, No. 3, 2003.

Huber et al., Fourier Domain Mode Locking (FDML): A new laser operating regime and applications for optical coherence tomography, Optics Express, Apr. 17, 2006, vol. 14, No. 8, 3225-3237.

Yamashita et al., Wide and fast wavelength-tunable mode-locked fiber laser based on dispersion tuning, Optics Express, Oct. 2, 2006, vol. 14, No. 20, 9299-9306.

Notification Concerning Transmittal of International Preliminary Report on Patentability dated Nov. 25, 2010, forwarding International Preliminary Report on Patentability dated Nov. 17, 2010, in counterpart International Application No. PCT/JP2009/059102.

\* cited by examiner

LASER APPARATUS, DRIVING METHOD OF THE SAME AND OPTICAL TOMOGRAPHIC IMAGING APPARATUS

TECHNICAL FIELD

The present invention relates to a laser apparatus, driving method of the laser apparatus and an optical tomographic imaging apparatus using the laser apparatus as a light source.

BACKGROUND ART

An optical tomographic imaging apparatus has been widely used recently as a medical imaging apparatus. Particularly, an optical tomographic imaging apparatus by optical coherence tomography (hereinafter, called "OCT") using multi-wavelength light interference can obtain a tomographic image of an eye ground (fundus oculi) up to a depth of several millimeters with depth resolution on the order of microns. Therefore, the optical tomographic imaging apparatus has had a growing importance as a diagnostic tool for providing important information which is unable to be obtained by a conventional scanning laser ophthalmoscope (SLO).

OCT in various forms was described in detail in Non-Patent Document 1 ("Optical Coherence Tomography" by M. Brezinski, Wily, London, 2006). A TD-OCT (Time domain OCT) combining a wideband light source with a Michelson interferometer is configured so that it scans a delay of a reference arm to measure light interfering with backscattered light of the signal arm, thus obtaining information on depth resolution.

However, in such TD-OCT, it is difficult to take an image at a high speed, and OCT in a form as described below is known as a method for taking an OCT image at a higher speed. For example, a known OCT for obtaining interferogram with a spectroscope using a wideband light source includes an SD-OCT (Spectral domain OCT). Further, an SS-OCT (Spectrally swept OCT) is known as OCT for obtaining interferogram in chronological order using a frequency scanning light source.

Then, in the SS-OCT described above, the frequency scanning rate of the frequency scanning light source is an important factor for improving the frame rate and the volume rate. The frequency scanning light source is set in Fourier domain mode locking and buffered by a fiber ring, thereby achieving a scan rate of about 200 kHz (A scan rate), Non-Patent Document 2 ("Opt. Exp." by R. Huber, et al., Vol. 14, pp. 3225, 2006) disclosed that by using this light source, scanning can be performed at a frame rate of about 900 Hz and a volume rate of 3.5 Hz.

Meanwhile, Non-Patent Document 3 ("Opt. Exp." by S. Yamashita, et al., Vol. 14, pp. 9399, 2006) disclosed that in recent days, OCT uses a wavelength-tunable laser by a dispersion tuning method that has been developed recently in the field of communication technologies. This dispersion tuning method uses the principle that dispersion in a resonator can be utilized to change a wavelength in response to change in mode-locked frequency. According to this principle, a mechanical drive member is not required to scan wavelength at a high speed, which can allow the wavelength to be scanned at a high speed. Further, Patent Document 1 (Japanese Patent Application Laid-Open No. 08-222790) proposed a laser apparatus using such dispersion tuning method and adapted to be capable of controlling oscillation wavelength. This laser apparatus includes a positive dispersion region, a negative dispersion region and two modulators in a ring resonator, and is adapted to make the amount of wavelength dispersion approximately zero and generate a single-wavelength light pulse in the ring resonator.

DISCLOSURE OF THE INVENTION

In some recent applications of OCT, it is increasingly expected to achieve three dimensional imaging at a higher speed. However, also in the Fourier domain mode locked laser described above, a variable filter is mechanically driven in the resonator and a modulation speed has an upper limit (<100 kHz), and accordingly it is difficult to achieve higher speed. Further, buffering requires a longer length of the resonator (>1 km) and also stability of the light source is deteriorated. Meanwhile, also in the case of using the dispersion tuning disclosed in Non-Patent Document 3 ("Opt. Exp." by S. Yamashita, et al., Vol. 14, pp. 9399, 2006), the gain in the resonator is finite and a pulse rise time defined by this finite gain specifies the upper limit of the scan rate, and accordingly the frequency scanning rate is limited to about 200 kHz. Further, regarding the laser apparatus described in Patent Document 1 (Japanese Patent Application Laid-Open No. 08-222790), it is disclosed that a ring resonator by the dispersion tuning described above includes two modulators and generates a single-wavelength light pulse therein. However, it is not disclosed there that the drive signal for driving these modulators is phase modulated to generate light pulses having a plurality of wavelengths in the ring resonator to improve the scan speed to achieve a scan rate equal to or more than 1 MHz.

The present invention can improve scan speed in view of the above problems, and an object thereof is to provide a laser apparatus capable of achieving a scan rate equal to or more than 1 MHz, a driving method of the laser apparatus and an optical tomographic imaging apparatus using the laser apparatus as a light source. The present invention provides a laser apparatus, a driving method of the laser apparatus and an optical tomographic imaging apparatus using the laser apparatus as a light source, configured in a manner described below. The laser apparatus according to the present invention is a laser apparatus including a ring resonator, and the ring resonator has a structure in which a first modulator, a normal dispersion region, a second modulator and an anomalous dispersion region are arranged in this order, and in this arrangement, a gain medium is included, and it is configured so that modulation with respect to the second modulator can be caused to be phase modulation by periodically superimposing phase modulation on modulation with respect to the first modulator. Further, the driving method according to the present invention is a driving method of the laser apparatus described above, in which upon driving the first modulator and the second modulator with a drive signal, a drive signal for the second modulator is obtained by adding phase modulation to a drive signal for the first modulator to drive. Further, the optical tomographic imaging apparatus according to the present invention is an optical tomographic imaging apparatus in which light from a light source is split into two light beams, one of the two light beams is directed to an object to be measured and the other light beam is directed to a reference mirror, and by using interfering light generated by interference between backscattered light of the one light beam reflecting off the object to be measured and reflected light of the other light beam reflecting off the reference mirror, and then a tomographic image of the object to be measured is taken, in which the light source is comprised of a laser apparatus as described above. The present invention can improve scan speed and provide a laser apparatus capable of achieving a scan rate equal to or more than 1 MHz, a driving method of the laser apparatus and an optical tomographic imaging apparatus using the laser apparatus as a light source.

Further features of the present invention will become apparent from the following description of exemplary embodiments with reference to the attached drawings.

BEST MODES FOR CARRYING OUT THE INVENTION

Figure 1C:
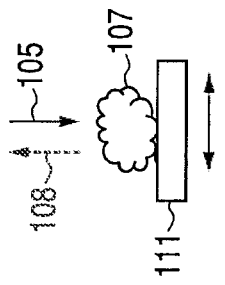
FIG. 1C is a view schematically illustrating the optical tomographic imaging apparatus according to the embodiment of the present invention, illustrating an exemplary configuration in which a measuring object is fixed on a stage and the location of the object is scanned.

Using the configurations described above, the scan speed can be improved, which can achieve a scan rate equal to or more than 1 MHz, and it is based on findings by the inventors as described below. The inventors have found that two modulators are provided in a laser apparatus including a ring resonator using dispersion tuning, and when the two modulators are driven, the drive signal for one of the modulators is phase modulated, thereby a scan rate equal to or more than 1 MHz can be achieved. It has been found that light pulses of a plurality of wavelengths are generated in the ring resonator, and a scan rate equal to or more than 1 MHz can be achieved. That is, this differs from Patent Document 1 (Japanese Patent Application Laid-Open. No. 08-222790) described above because it disclosed that a single-wavelength light pulse is generated with the drive signal of one of the two modulators not being phase modulated, and the principle of the present invention is that the drive signal, of one of the two modulators is phase modulated to generate light pulses of a plurality of wavelengths in the ring resonator. Therefore, such configuration of the present invention can achieve the scan rate equal to or more than 1 MHz.

Now, embodiments of the present invention in which those are specifically constructed will be described hereinafter. In a laser apparatus according to the present embodiment, a laser apparatus including a ring resonator using dispersion tuning can be configured as described below. That is, the ring resonator constituting the laser apparatus includes a gain medium for generating light, an amplitude modulator as a first modulator and a second modulator, a normal dispersion region formed of, for example, a fiber as a medium for dispersing light, and an anomalous dispersion region formed of, for example, a fiber as a medium for compensating for light dispersion. Then, the ring resonator is configured in a manner that a first modulator, a normal dispersion region, a second modulator and an anomalous dispersion region are arranged in this order, and in this arrangement, a gain medium is included, and it is configured so that modulation with respect to the second modulator can be caused to be phase modulation by periodically superimposing phase modulation on modulation with respect to the first modulator. Note that the amplitude modulation unit as described above may include a Mach-Zehnder type electro-optic modulator, an electro-absorption type modulator, an acousto-optic modulator and a combination of a Pockels cell and a polarization beam splitter. As described above, configured is a mode-locked laser having an oscillation wavelength that is dependent on a phase difference between a first modulation unit and a second modulation unit, is tunable and formed of a higher harmonic. Because of including the normal dispersion region and the anomalous dispersion region, the resonator circulation time can be less dependent on wavelength, and accordingly, wavelength dependence of the repetition frequency can be made small to be negligible. Further, as described above, modulation with respect to the second modulator is caused to be phase modulation by periodically superimposing phase modulation on modulation with respect to the first modulator, thus making it possible to provide a light source in which the frequency is periodically scanned. At that time, variation in repetition frequency is negligible, thereby enabling high-speed frequency scanning by high speed, phase modulation. These can be achieved, more specifically, upon performing phase modulation in the second modulator, by configuring it to satisfy the following conditional expression when phase modulating the gate delay time between the first modulator and the second modulator, where the modulation frequency in the first modulator is $f_m$, the phase modulation frequency in the second modulator is $f_p$, and the pulse circulation time dependent on wavelength is $T_r$:

$$1/f_m < 1/f_p = T_r/n$$

where n is any integer. Further, in the laser apparatus according to this embodiment, the period of the phase modulation in the second modulator can be set to one over an integer of the time to circulate once in the ring resonator at a speed of the wavelength of light circulating in the ring resonator. Accordingly, even if the phase modulation frequency is larger than the basic-mode-locked frequency of the ring resonator, the oscillation condition can be met. Further, a pulse train having different wavelengths in terms of time is obtained as an output, and its frequency scanning rate is given as a phase modulation period, thus enabling high-speed wavelength scanning. In addition, in the laser apparatus according to this embodiment, the normal dispersion region or the anomalous dispersion region can be composed of a polarization preserving fiber. Here, the polarization preserving fiber is configured so that two polarization wave major axes are provided by introducing anisotropy into a shape, stress distribution and the like of an optical fiber, usually having axial symmetry, to impart birefringence, and linearly polarized light can be stably transmitted along each axis. The polarization preserving fiber includes, for example, a PANDA type configuration in which two stress addition regions are disposed near a core. This can suppress variation in resonator circulation time caused by change in the environment to achieve stabilization.

Further, the laser apparatus according to this embodiment can be adapted to have a unit of performing feedback control of timing of a pulse output signal output from the ring resonator with respect to the first modulator. This can stabilize the mode-locking for a long period. Further, the laser apparatus according to this embodiment can be adapted to have a unit of performing feedback control of the second modulator with a signal that is a pulse output signal output from the ring resonator and detected by an external passive optical resonator. Therefore, the wavelength of each pulse can be stabilized.

Also, the laser apparatus according to this embodiment can be adapted to have a unit by which the ring resonator continuously changes a group delay. Note that the unit of continuously changing the group delay may include a fiber-expanding type delay circuit, and a grating type or prism type pulse expander/compressor. Further, the laser apparatus according to this embodiment can be adapted to have a unit of performing feedback control of a unit of detecting a pulse output signal output from the ring resonator by the external passive optical resonator to continuously change the group delay with the signal detected. The wavelength of each pulse can be stabilized accordingly.

Also, the laser apparatus according to this embodiment can be configured such that the gain medium, the first modulator and the second modulator are comprised of the same element. Therefore, the number of components in the resonator can be reduced, thus lowering the cost. Further, the laser apparatus according to this embodiment can be adapted to have a unit by which the ring resonator passively shapes a spectrum. Here, the spectrum shaping unit may include a combination of a gain medium with an excitation source, and a combination of a spatial liquid crystal modulator with a long-period fiber grating, an etalon and an element imparting angular dispersion. Accordingly, this can not only flatten wavelength dependence of a gain but can control an oscillation wavelength, thus enabling stabilization of both of variation in output and oscillation wavelength. Further, according to this embodiment, a driving method of the laser apparatus described above can be provided as described below. When the first modulator and the second modulator are driven with a drive signal, a drive signal for the second modulator is driven by adding phase modulation to a drive signal for the first modulator, thereby light pulses having a plurality of wavelengths can be generated in the ring resonator. Further, by using the laser apparatus according to this embodiment as a light source, an optical tomographic imaging apparatus as described below can be provided. That is, light from a light source that is the laser apparatus described above is split into two light beams, and one of the two light beams is directed to an object to be measured and the other light beam is directed to a reference mirror. And by using interfering light generated by interference between backscattered light of the one light beam reflecting off the object to be measured and reflected light of the other light beam reflecting off the reference mirror, an apparatus adapted to take a tomographic image of the object to be measured can be configured. Therefore, at a frequency scanning rate given as a phase modulation period of the light source, an optical tomographic image of the object to be measured can be taken, and therefore, an optical tomographic imaging apparatus capable of taking an OCT image at a frame rate and a volume rate higher than conventional ones can be achieved.

Figure 1B:
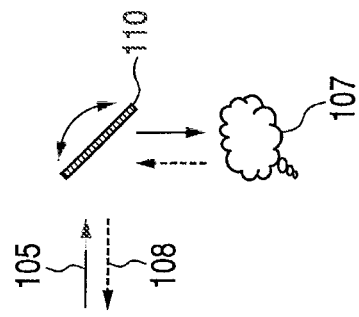
FIG. 1B is a view schematically illustrating the optical tomographic imaging apparatus according to the embodiment of the present invention, illustrating an exemplary configuration in which a signal beam is used for scanning by a beam scanning element.
Figure 1A:
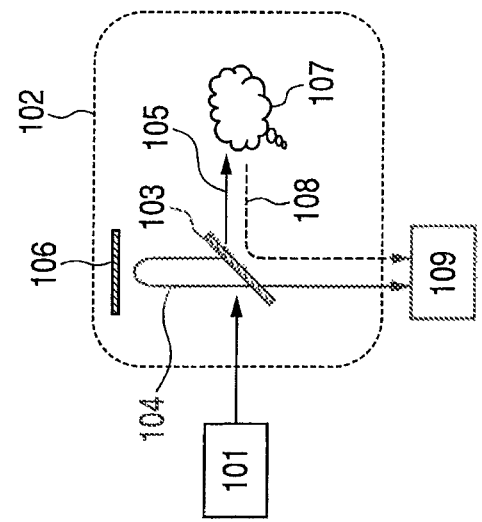
FIG. 1A is a view schematically illustrating an optical tomographic imaging apparatus according to an embodiment of the present invention, illustrating a basic configuration thereof in this embodiment.

The laser apparatus described above will be described in more detail with reference to the drawings. Here, firstly, before describing the laser apparatus according to this embodiment, an optical tomographic imaging apparatus using this laser apparatus as a light source will be schematically described. FIGS. 1A to 1C are views schematically illustrating the optical tomographic imaging apparatus according to this embodiment. FIG. 1A illustrates a basic configuration of the optical tomographic imaging apparatus according to this embodiment. FIG. 1B illustrates an exemplary configuration in which a signal beam 105 is caused to scan by a beam scanning element 110. FIG. 1C illustrates an exemplary configuration in which a measuring object 107 is fixed on a stage 111 and the location of the object is scanned. FIGS. 1A to 1C show a light source 101, a Michelson interferometer 102, a beam splitter 103, a reference beam 104, the signal beam 105, a reference mirror 106, the measuring object 107, a backscattered light 108, and a photodetector 109.

In the optical tomographic imaging apparatus according to this embodiment, light from the light source 101 enters the Michelson interferometer 102. The interferometer splits the light into the reference beam 104 and the signal beam 105 through the wideband beam splitter 103. The reference beam 104 reflects off the reference mirror 106 whose reflectance is optimized. Further, the signal beam 105 is incident on the measuring object 107, and the backscattered light 108 is generated. The reference beam 104 and the backscattered light 108 are optically measured by the photodetector 109.

In this system, to conduct scanning while varying the generation location of the backscattered light 108, the signal beam 105 may be caused to scan by the beam scanning element 110, for example, in a manner as shown in FIG. 1B. Alternatively, as shown in FIG. 1C, the measuring object 107 is fixed on the stage 111 and the location of the object may be scanned. In the case of beam scanning, a line-shaped beam may be used for scanning in a one-dimensional direction, or a point-shaped beam may be used for scanning in two-dimensional direction. Accordingly, the form of the photodetector 109 and the configuration of the optical system vary, but these are well known. For example, in the case of the line-shaped beam, the photodetector 109 may be in the form of arrays. Also, a protective measure such as an optical isolator for stopping light from coming back to the light source may be disposed between the light source 101 and the Michelson interferometer 102.

As a performance index of OCT, depth resolution and dynamic range are important. The depth resolution dz of OCT is expressed by the following expression (1):

$$dz \sim \frac{2\ln 2 \lambda^2}{n_s \pi \Delta \lambda} \quad (1)$$

Here, $\lambda$ is the center wavelength of the light source, $\Delta\lambda$ is the bandwidth of the light source, $n_s$ is the refraction index of the measuring object. The dynamic range of the depth in the SD/SS-OCT is expressed by the following expression (2):

$$L_D \sim \frac{1}{4n_s} \frac{\lambda^2}{\delta\lambda} \quad (2)$$

Here, $\delta\lambda$ is the wavelength resolution on measurement. In the case of the SD-OCT, this is determined by the spectroscopy performance of a spectroscope corresponding to the photodetector 109, and in the case of the SS-OCT, it is determined by a bandwidth of the high-speed photodetector 109 or the laser line breadth.

Next, a light source (laser apparatus) of the optical tomographic imaging apparatus according to this embodiment will be described. The light source according to this embodiment starts with varying a wavelength of a mode-locked laser composed of a higher harmonic using the dispersion tuning. A wavelength scanning light source using a mechanism of the dispersion tuning, as mentioned above, is described in Non-Patent Document 3. However, in the light source described in Non-Patent Document 3, as mentioned above, the pulse rise time defined by a finite gain specifies the upper limit of the scan rate, and accordingly the frequency scanning rate has its limitations in setting it beyond about 200 kHz.

To overcome such problems, after a light pulse mode-locked at some wavelength is circulated around a resonator, the pulse has to be subjected to the same phase modulation. For that purpose, the frequency modulation speed $f_m$ for wavelength scanning may be an integral multiple of the inverse of a pulse circulation time $T_r(\lambda)$ dependent on wavelength. This condition is expressed by the following expression (3):

$$f_m = m/T_r(\lambda) \quad (3)$$

where, m is a natural number. To provide light pulses having different colors in a resonator at the same time, the circulation times of the light pulses having respective colors have to be almost the same to each other. That is, dispersion of group velocity has to be approximately zero. However, this is contradictory with the principle of the dispersion tuning. It is because according to the principle of the dispersion tuning, wavelength tunability is achieved by varying the repetition frequency (modulation frequency $f_m$) to a finite dispersion value in the resonator. Then, to keep the repetition frequency constant while using the principle of the dispersion tuning, the approach disclosed in Patent Document 1 described above can be adopted. That is, a dispersion medium is disposed so as to balance a normal dispersion region (positive dispersion region) against an anomalous dispersion region (negative dispersion region), and an external modulator may be disposed in the middle of these two media, respectively.

Figure 2:
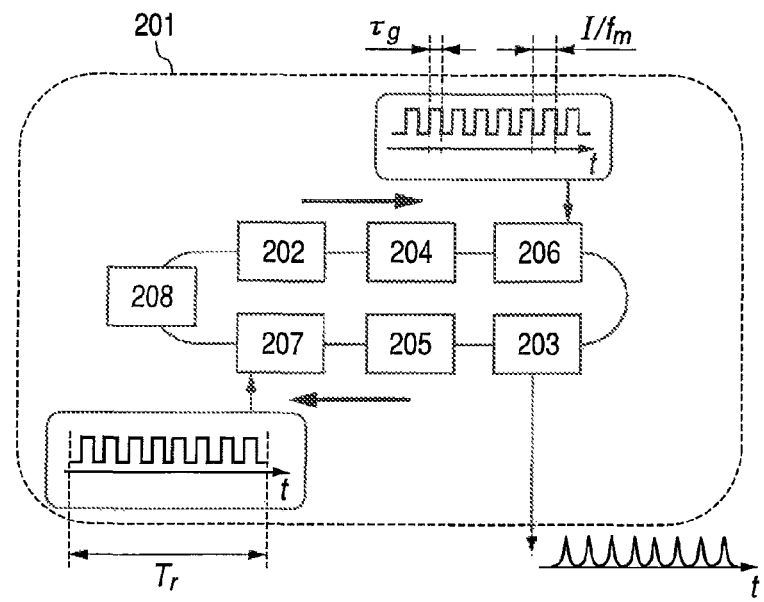
FIG. 2 is a view illustrating a basic configuration of a light source (laser apparatus) of an optical tomographic imaging apparatus according to an embodiment of the present invention.

FIG. 2 illustrates a basic configuration of a light source (laser apparatus) of an optical tomographic imaging apparatus according to this embodiment. FIG. 2 shows a gain medium 202, an output coupler 203, a normal dispersion medium 204, an anomalous dispersion medium 205, a first modulator 206 that is an external modulator, a second modulator 207 that is an external modulator, and an optical isolator 208.

A ring resonator 201 constituting the laser apparatus according to this embodiment includes the following members. That is, the gain medium 202, the output coupler 203, the normal dispersion medium 204, the anomalous dispersion medium 205, the first modulator 206, the second modulator 207, and the optical isolator 208 are included. Here, the optical isolator 208 insures operation in a single direction. The first modulator 206 and the second modulator 207 constituting the external modulator may be a semiconductor amplifier (SOA) also used as a gain medium. In this case, the gain medium 202 is not a necessary condition, but to suppress parasitic oscillation, in addition to the optical isolator 208, another optical isolator has to be disposed in the middle of the two SOAs (between the first SOA 206 and the second SOA 207).

Figure 5:
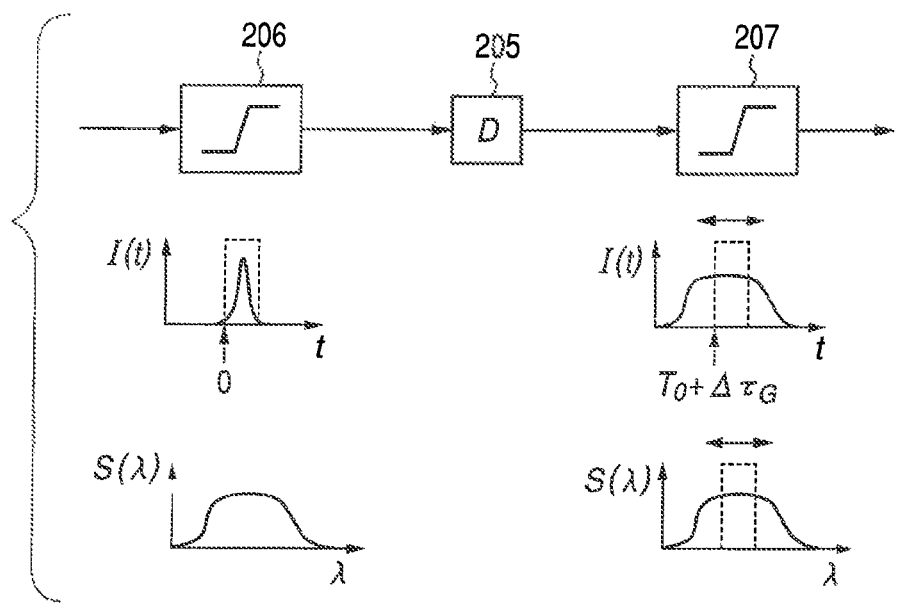
FIG. 5 is a view illustrating, in terms of time domain and wavelength range, respectively, that dispersion tuning is realized according to an embodiment of the present invention.

In a dispersion medium, a light pulse propagates at a different group velocity dependent on its color, and if there is a difference in modulation timing between the two external modulators, a color of low-loss at that instant in the resonator is limited. That is, dispersion tuning is achieved. FIG. 5 illustrates this situation in terms of time domain and wavelength range, respectively. A pulse that was gated by the first modulator 206 and passed through the anomalous dispersion medium 205 (dispersion medium D) is temporally broadened due to an effect of dispersion of group velocity of the dispersion medium. Then, the phase is shifted to gate the second modulator 207, which can allow only some wavelength component to pass therethrough. As described above, subsequently allowing a dispersion medium that compensates the dispersion medium D to pass through satisfies the expression (3) for any wavelength. However, if there is one external modulator even with dispersion compensation being applied, such effect cannot be expected. It is because if the chirp becomes maximized at an intermediate location between the normal dispersion medium and the anomalous dispersion medium for the one in which the modulator is not provided, all wavelengths can pass through the gate of the modulator at the same instant.

To describe more quantitatively, the case where two modulators are connected to each other by an optical fiber is described, for example. A relative group delay time for a light pulse to pass through the first modulator to arrive at the second modulator is dependent on wavelength and expressed by the following expression (4):

$$\Delta\tau(\lambda) = (\lambda - \lambda_0)DL \quad (4)$$

where, L is the length of a fiber, and D is the dispersion parameter of the fiber at a wavelength of $\lambda_0$. The gate delay time $\Delta\tau_G$ between the two modulators is varied within a range according to the following expression (5), and accordingly change in the wavelength that passes through the two modulators changes, where the maximum group delay time within a wavelength-tunable range is $\Delta\tau_{max}$:

$$T_0 < T_0 + \Delta\tau_G < T_0 + \Delta\tau_{max} \quad (5)$$

where, $T_0 = L/v_g$, and $v_g$ is the group velocity. To improve color separation, the gate time $\tau_G$ of the modulator has to be sufficiently shorter than the relative group delay time imparted by the optical fiber.

On the one hand, the modulation frequency $f_m$ (repetition frequency of the gate) of the modulator has to be larger than the inverse of $\Delta\tau_{max}$. These two conditions give a binding condition according to the following expression (6) to the range of the group delay time:

$$\tau_G \ll \Delta\tau_{max} < 1/f_m = T_r/m \quad (6)$$

While satisfying the resonance condition, to phase-modulate $\Delta\tau_G$ so that the second modulator satisfies the expression (5), its phase modulation frequency $f_p$ has to satisfy a condition according to the following expression (7):

$$1/f_m < 1/f_p = T_r/n \quad (7)$$

where n is any integer. Therefore, the first and second modulators are modulated at a repetition frequency satisfying the expression (6), and the gate delay time $\Delta\tau_G$ is phase-modulated in the second modulator so as to satisfy the expressions (5) and (7). Accordingly, pulses having m/n different wavelengths can circulate within a resonator at approximately the same time intervals, so that pulses having different colors are mode-locked.

Note that a general mechanism of a higher harmonic mode-locking is attributable to losses caused by the situation that a light pulse passing through a gate is temporally broadened due to self-phase modulation. For each of the basic mode locking or low-order higher harmonic mode locking is achieved, and the pulses each try to acquire a gain and broaden their spectral bandwidth, resulting in temporally broadening due to an effect of dispersion of the group velocity. Then, a loss is produced by the gate of the modulator, and the gain is subjected to negative feedback, thus achieving mode-locking.

In a Common mode-looking model, it is assumed that temporal coherence is infinite. That is, a mode structure to be mode-locked is regarded as a delta function. That is, it is supposed that there is a pulse train (periodicity). As described above, if the pulse train is composed of pulses having m/n different wavelengths, mutual coherence is not necessarily required between the pulses as fat as a nonlinear optical effect (for example, cross phase modulation) does not intervene. This is because it is satisfactory so far as the mode interval of a single pulse is $1/T_r$. That is, even if spectra of adjacent pulses do not overlap with each other, the mode structure can exist. Here, focusing on one pulse, even while the pulse propagates through another zone in a resonator, the gate is opened and closed by an amplitude modulator. As the result, coherence of a laser output is deteriorated. However, when the pulse focused on is spatially away from the gate, a noise component caused by opening and closing of the gate (ASE: amplified spontaneous emission) results in being suppressed because the gain is absorbed by another wavelength component having the highest transmission factor at a timing of the opening and closing of the gate. Note that when the spectra of adjacent pulses overlap, the opening and closing of the gate may be regarded as adiabatic change. Therefore, it can be concluded that even if the mode structure is taken into consideration, the operation as described above is realized.

Note that in the above description, the optical fiber is a dispersion medium, but it may be, for example, a multichannel group delay element having a finite bandwidth such as a super-structure fiber diffraction grating and an arrayed waveguide diffraction grating. Using these optical components can shorten the length of a resonator and extend the mode interval, and accordingly a mode hop is not likely to take place and a light source more robust to the environment can be provided.

Even if an optical fiber is used as the dispersion medium, to secure stability to the environment, the dispersion parameter D is made larger. If the dispersion parameter D is larger, an effect of change in length of a resonator due to temperature change can be made relatively smaller. Where the effective length of the resonator is $L_{eff}=n_{eff}L$, dependence on temperature change is $dL_{eff}/dT=L\, dn_{eff}/dT$. For example, in the silica-glass constituting an optical fiber ring, dn/dT is approximately $1\times10^{-5}$ (1/° C.), and when L=100 m, $dL_{eff}/dT$ is approximately 1 (mm/° C.). On the one hand, the length of the resonator due to an effect of dispersion is $dL_{eff}/d\lambda=c\, DL/n_{eff}$. Where L=100 m, and, for example, D=−50 ps/nm/km, then $dL_{eff}/d\lambda=1$ mm/nm. Therefore, the effect due to temperature change on the length of the resonator becomes small when it is considered as wavelength dependence.

EXAMPLES

Hereinafter, examples of the present invention will be described.

First Example

Figure 3:
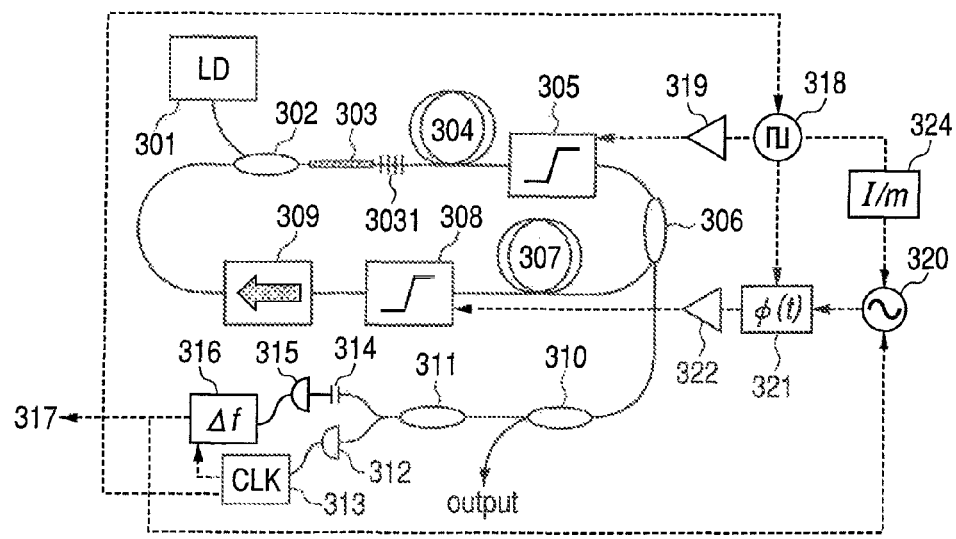
FIG. 3 is a view illustrating an exemplary configuration of a laser apparatus of a band of 1.55 µm used as a light source of OCT according to a first example of the present invention.

In a first example, an exemplary configuration of a laser apparatus of a band of 1.55 μm to be applied to a light source for OCT will be described. FIG. 3 illustrates an exemplary configuration of a laser apparatus according to this example. FIG. 3 shows an excitation laser diode (LD) 301, a WDM coupler 302, an erbium-doped optical fiber (EDF) 303, a gain equalizer 3031, a normal dispersion optical fiber 304, a first LN electro-optic modulator (EOM) 305, an output coupler 306, an anomalous dispersion optical fiber 307, and a second LN electro-optic modulator (EOM) 308. Further, an isolator 309, a tap coupler 310, a 3-dB coupler 311, a photodetector 312, a clock extraction circuit 313, an external passive optical resonator 314, a photodetector 315, and a signal processing circuit 316 are shown. Also, shown are an output 317 for processing an OCT signal, an RF synthesizer 318, an RF amplifier 319, an RF signal source 320, an RF phase modulator 321, an RF amplifier 322, and a frequency divider 324.

A laser resonator constituting the laser apparatus according to this example includes the erbium-doped optical fiber (EDF: 300 ppm, 6 m) 303, the gain equalizer 3031, and the normal dispersion fiber (D=−100 ps/nm/km, 200 m) 304. Further, it includes an LiNbO₃ (LN) electro-optic modulator (EOM: $V_p$ being approximately 4 V, bandwidth being 10 GHz) 305 that is the first LN modulator. Also, it includes the output coupler (5/95) 306, the anomalous dispersion fiber (D=70 ps/nm/km, 285 m) 307, and the second LN electro-optic modulator (EOM) 308. Further, it includes the optical isolator 309, and the WDM coupler (980/1550 nm) 302. Then, these constitutes a polarization preserving optical fiber ring, and the erbium-doped optical fiber (EDF) 303 is excited by the excitation laser diode (LD: 300 mW, λ=980 nm) 301 of the grating stabilizing type through the WDM coupler 302. The RF synthesizer 318 generates signals for driving the first LN electro-optic modulator (EOM) 305 and the second LN electro-optic modulator (EOM) 308 and drives the first LN electro-optic modulator (EOM) 305 through the RF amplifier 319. Another signal output of the RF synthesizer 318 is phase-modulated by the phase modulator 321 driven by another RF signal source 320 and amplified by the second RF amplifier 322, and subsequently drives the second LN electro-optic modulator (EOM) 308. The modulation frequency of the RF signal source 320 is synchronized with the signal from the RF synthesizer 318 through the frequency divider 324.

The excitation laser diode (LD) is excited at 150 mW and an output of about 1.5 mW can be provided. The laser resonator has a length of 500 m and F is approximately 410 kHz. The RF synthesizer 318 is driven at a $f_m$ of about 1 GHz and $\tau_g$ of 100 ps. Instead of the RF signal source 320, a direct-current voltage is applied (the phase modulator 321 is used as a phase shifter), which can provide a higher harmonic mode-locking at a m of about 2400. The oscillation wavelength λ is about 1550 nm and the spectral bandwidth is about 0.2 nm. Change in direct-current voltage changes the oscillation wavelength. It is because a wavelength of light gated by the second LN electro-optic modulator (EOM) 308 changes. When the phase shift is varied within a range of from approximately −π to approximately π, the wavelength is tuned within a range of from 1525 nm to 1565 nm. Owing to the gain equalizer 3031, output variation is about 0.1 mW. In this example, the optical fiber has D=70 ps/nm/km and the length of 285 m, and accordingly the group delay time is 19.6 ps/nm and the change in wavelength of 40 nm corresponds to a change in delay of about 780 ps. The time interval of the RF gate pulse is made shorter, resulting in the wavelength being more widely tunable.

Next, the RF signal source 320 is synchronized with the RF synthesizer 318 and modulated. The modulation frequency of the RF signal source 320 is $f_m/m$, and an integral multiple of this satisfies the expression (3), so that mode-locking can be maintained. As the amplitude is gradually increased, the bandwidth of the spectrum to be observed is broadened, but actually, light pulses having different colors are output in chronological order. When the amount of phase shift of the phase modulation is within a range of from $-\pi$ to $\pi$, the spectral bandwidth is about 40 nm. The wavelength scanning rate is dependent on a modulator in the RF signal source 320 and approximately 400 kHz at the minimum (corresponding to F). For example, if the RF signal source 320 is driven at the four times frequency, $f_m/m$, the scan rate is about 1.6 MHz.

In this example, the polarization preserving fiber ring is used, so that there is no instability caused from polarization fluctuation. However, the resonator has the length of 500 m, so that $dL_{eff}/dT$ is approximately 5 (mm/° C.) and $dL_{eff}/d\lambda=4$ (mm/nm). Change in resonant frequency per degree C. is on the order of several Hz, and in a laboratory environment, it is sufficiently stable, but change in mode-locking due to temperature change of 1° C. causes change in the weighted center of the wavelength scanning bandwidth of about 1.25 nm. Feedback control can be conducted in view of stability to the environment and wavelength stability for stably obtaining the OCT signal.

Then, next, a method for stabilizing timing and wavelength will be described. The tap coupler (10/90) 310 branches the output of the laser to output for monitoring, and the output of the laser is split into two signals by the 3-dB coupler 311, and one of the two signals is directly detected by the high-speed photodetector 312. The timing circuit (clock extraction circuit) 313 extracts the timing and feeds it back to the RF synthesizer 318. In this case, all timings are synchronized with the timing of the RF synthesizer 318, and accordingly a high-speed feedback circuit becomes necessary, but a simple configuration is achieved. In this case, the repetition frequency of a pulse train follows length fluctuation of the fiber, and mode-locking is maintained, but the wavelength is not stabilized. Therefore, there is a need for a unit of transmitting change in output wavelength to the OCT image processing unit.

Next, a method for such purpose will be described. The other signal of the 3-dB coupler is detected by the photodetector 315 through the external passive optical resonator (FSR: $F_p$ about 1 GHz) 314. Making $F_p$ approximately equal to $f_m$ can provide a moderate envelope waveform. The component of fluctuation has a lower frequency with respect to FSR, and its temporal change corresponds to temporal change in wavelength. The signal processing circuit (signal processing unit) 316 detects change in wavelength of each pulse from that in the preceding period by using timing information in which the phase is adjusted and which is supplied from the timing circuit 313 to output the change to the OCT image processing unit (the output for processing an OCT signal) 317. Accordingly, interferogram of the OCT signal can be calibrated in real time. At that time, the external passive optical resonator 314 and the spectrum of the laser output are preliminarily calibrated.

Further, to stabilize the wavelength, the output of this signal processing circuit 316 may be fed back to the RF signal source 320. In this case, while the mode-locking is maintained, the wavelength can be stabilized, thus reducing a load on the OCT image processing unit 317. In this case, variation in repetition frequency of the output takes place, but there is no substantial problem in taking an image as far as the OCT image processing unit is provided with a trigger signal.

Figure 6:
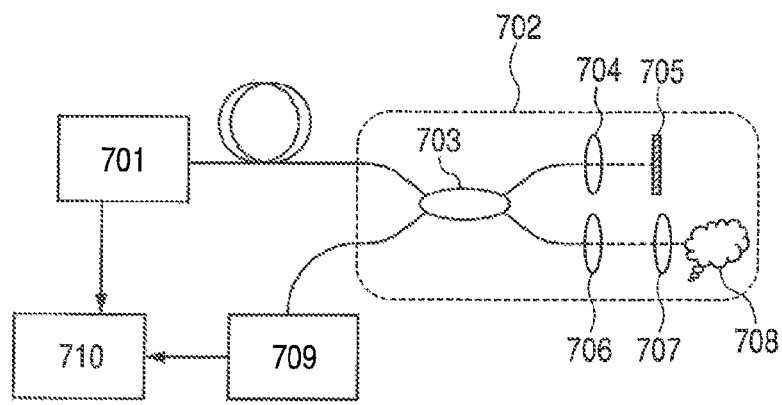
FIG. 6 is a view illustrating an overall configuration of OCT according to the first example of the present invention.

FIG. 6 illustrates an overall configuration of OCT according to this example. Light emitted by a light source 701 enters a fiber type Michelson interferometer 702. A reference beam branched by a 3-dB coupler 703 is radiated to a reference mirror 705 through a collimator lens 704, and reflected light reflecting off the mirror 705 again comes back to the coupler 703 through the collimator lens 704. A signal beam is collimated by a collimator lens 706 and subsequently collected on a sample 708 by an achromatizing lens 707. Backscattered light coupled to a signal arm is superimposed on the reference beam by the 3-dB coupler 703 and subsequently coupled to a photodetector (InGaAs photodiode) 709 having a transimpedance amplifier to take out a time-series interferogram.

The scan rate is about 1.6 MHz and the pulse repetition frequency is about 1 GHz, and accordingly the light is divided into about 625 wavelength components. The bandwidth $\Delta\lambda$ is about 45 nm, so that $\delta\lambda$ is about 0.07 nm. However, the wavelength resolution is the spectral bandwidth of about 0.2 nm of an actual mode-locked pulse.

The depth resolutions in water ($n_s$: about 1.333) are about 20 μm and about 2.3 μm from the expressions (1) and (2), respectively. On the one hand, from the instantaneous spectral bandwidth, 225 wavelength components to divide the bandwidth are sufficient, and the dynamic range is not deteriorated if the scan rate is increased to about 4.4 MHz (10×F).

The signal-processing/image-display unit 710 carries out synchronization, calibration of interferogram and Fourier transformation using a control signal from the light source 701 and reproduces an optical tomographic image. The unit 710 can provide 256 lines in combination with a scanner of about 17 kHz, and it can provide 256×256 A-scan signals if its orthogonal axis is manipulated by a scanner of 60 Hz. Therefore, hardware having a video rate equal to or more than 60 Hz can provide a volume image.

OCT being operable at a speed equal to or more than 1 MHz and of a high dynamic range ($L_d$>2 mm) and a wavelength of the band of 1.55 μm has been described hereinbefore.

Second Example

Figure 4:
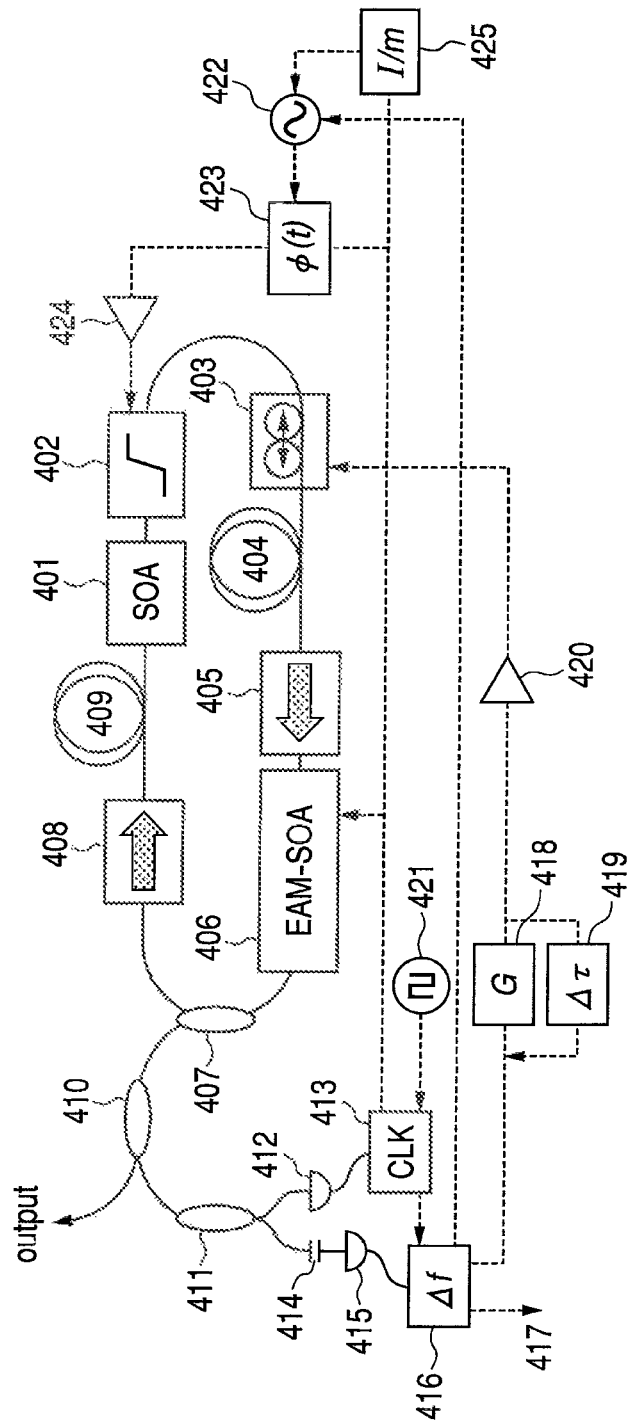
FIG. 4 is a view illustrating an exemplary configuration of a laser apparatus of a band of 1.3 µm used as a light source of OCT according to a second example of the present invention.

In a second example, an exemplary configuration of a laser apparatus of a band of 1.3 μm to be applied to a light source for OCT will be described. FIG. 4 illustrates an exemplary configuration of a laser apparatus according to this example. FIG. 4 shows an SOA 401, an LN modulator 402, a fiber stretcher 403, an anomalous dispersion fiber 404, an isolator 405, an EAM-SOA 406, an output coupler 407, an isolator 408, and a normal dispersion fiber 409. Further, a tap coupler 410, a 3-dB coupler 411, a photodetector 412, a clock extraction circuit 413, an external passive optical resonator 414, a photodetector 415, a signal processing circuit 416, and an output 417 for processing an OCT signal are shown. Also an amplifier 418, a delay circuit 419, a high-voltage amplifier 420, an RF synthesizer 421, an RF signal source 422, an RF phase modulator 423, an RF amplifier 424, and a frequency divider 425 are shown.

A laser resonator constituting the laser apparatus according to this example includes the SOA 401 and the LN modulator (EOM: $V_p$ being about 4 V, 40 GHz) 402. Also, it includes the anomalous dispersion fiber (D=100 ps/nm/km, 200 m) 404, the fiber stretcher 403 and the isolator 405. Further, it includes the SOA (EAM-SOA: 30 GHz) 406 having an electro-absorption type modulator, the output coupler (10/90) 407, the isolator 408 and the normal dispersion fiber (D=−140 ps/nm/km, 145 m) 409. Then, these constitute a polarization preserving fiber ring. The anomalous dispersion fiber is a side-pit type polarization preserving fiber and has a propagation loss of about 5 dB/km and fusion loss of about 0.3-dB to a standard polarization preserving fiber. There is such a merit that the EAM-SOA 406 can not only sufficiently compensate for insertion loss of EAM by SOA amplification function, but an modulate faster than direct SOA modulating, and can be made more compact than an LN modulator. Although the extinction ratio is low, an output side-mode suppression ratio of 30 dB or more can be secured because of usage in the resonator. Further, a chirp caused from a high-speed operation can be negligible because it is small compared to dispersion of the optical fiber used in this example. Also, even if the chirp cannot be negligible because of an especially short gate time, it can be suitably used in this example because the timing can be controlled with such situation being taken into consideration.

A monitor signal is extracted from an output signal from the output coupler 407 by the tap coupler 410 (10/90) and split into two signals by the 3-dB coupler 411. One of the two signals is directly detected by the photodetector 412, and a clock signal is extracted therefrom, and a modulation signal is output to the EAM-SOA 406. A signal phase-controlled with respect to a signal of the RF synthesizer 421 is used as an output signal to the EAM-SOA 406 and the EOM 402 until mode-locking is stabilized. Accordingly, the mode-locking is activated and maintained. Further, the external RF signal source 422 is also synchronized with the clock signal through the frequency divider 425.

The other light signal is detected through the external passive optical resonator 414 and detected by another photodetector 415. At both ends of a wavelength-tunable bandwidth, the amount of dispersion compensation does not become completely zero, and accordingly the output of the signal processing circuit 416 has a clearly periodic structure dependent on a modulation period of the RF signal source 422. This time period is proportional to the inverse of finesse, and accordingly the fiber stretcher 403 is controlled through a negative feedback circuit including the amplifier (gain circuit) 418 and the delay circuit 419, and the high-voltage amplifier 420. In this way, the length of the resonator is adjusted in accordance with change in the environment, so that the repetition frequency is stabilized.

The wavelength depends on an offset voltage of the RF signal source 422. Therefore, the signal processing circuit 416 outputs a signal obtained by detecting a difference in wavelength by comparing with the signal in the preceding period, and thereby feeds the signal back for controlling the offset of the RF signal source 422. In such a manner, the wavelength is stabilized. This signal can be also used as a calibration signal of the interferogram, so that it may be transmitted to the OCT image processing unit 417. However, if the wavelength is stabilized and already-known (for example, from observation using a spectroscope), real-time calibration is unnecessary. Further, by controlling a scan profile of the RF signal source, wavelength scanning can be also adapted to be approximately linear in the frequency range so that it becomes suitable for taking the interferogram.

When the SOA 401 is driven at 600 mA, an output of about 1 mW can be provided. The length of the laser resonator is 360 m, so that F is about 570 kHz. The RF synthesizer 421 is driven at a $f_m$ of about 500 MHz and $\tau_g$ of 60 ps. The higher harmonic mode-locking can be achieved at a m of about 875. The RF signal source 422 is synchronized with a divided signal of the RF synthesizer 421 (frequency divider: 425), and modulates the phase modulator 423 at about 1.14 MHz (2×F), and this modulation signal is amplified by the RF amplifier 424 to drive the EOM 402. Therefore, the timing of the gate of the EOM 402 is periodically modulated relative to that of the gate of the EAM-SOA 406. For light gated by the EOM 402, the time to reach the EAM-SOA 406 varies depending on wavelength because of the optical fiber 404, thereby dispersion tuning is provided. The oscillation frequency is between 1260 and 1340 nm, and the spectral bandwidth is about 0.3 nm. The optical fiber has a D of 100 ps/nm/km and the length of 200 m, so that the group delay time is 20 ps/nm, and a change in wavelength of 80 nm corresponds to a change in delay of 1.6 ns. In this case, it can be concluded that the wavelength-tunable bandwidth is limited to the gain bandwidth.

Because the bandwidth Dλ is about 80 nm and the mode-locked pulse has a spectral bandwidth of about 0.3 nm, it is sufficient to detect about 266 wavelength components. Because $f_m$=500 MHz, the dynamic range is not deteriorated if the scan rate is increased to about 1.7 MHz (3×F). From expressions (1) and (2), the depth resolution in water ($n_s$: about 1.333) is about 7 μm, and the dynamic range is about 1.1 mm. Note that by switching the frequency divider 425, the scan rate can be changed, and for example, when it is desired to take an optical tomographic image in the vicinity of a surface at a higher S/N, the maximum frequency dividing ratio can be set. The SS-OCT signal is synchronized with the output of the signal processing circuit 416 and obtained, and accordingly the SS-OCT signal can be switched from a user interface as an image display mode, being linked with change in the frequency dividing ratio. OCT of the wavelength band of 1.3 μm operable at a high speed equal to or more than 1 MHz and having a high resolution (dz<10 μm) has been described hereinbefore.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-125642, filed May 13, 2008 which is hereby incorporated by reference herein in its entirety.

The invention claimed is:

1. A laser apparatus comprising:
   a ring resonator, wherein the ring resonator includes a first modulator, a normal dispersion region, a second modulator, and an anomalous dispersion region arranged in order, and wherein ring resonator further includes a gain medium;
   an RF synthesizer generating signals for driving the first modulator and the second modulator;
   a phase modulation applying unit that applies a periodic modulation to a phase difference between the signal for driving the first modulator and the signal for driving the second modulator;
   a frequency divider dividing a first frequency by a natural number; and
   an RF signal source driving the phase modulation applying unit and being driven with a second frequency of an integral multiple of the divided first frequency.

2. The laser apparatus according to claim 1, wherein a parameter of the periodic modulation applied to the phase difference between the first modulator and the second modulator satisfies the following conditional expression:

$$f_m > f_p$$

where $f_m$ is a modulation frequency in the first modulator, and $f_p$ is a frequency of the periodic modulation applied to the phase difference.

3. The laser apparatus according to claim 1, wherein at least one of the normal dispersion region and the anomalous dispersion region is a polarization preserving fiber.

4. The laser apparatus according to claim 1, further comprising:

a feedback control unit that performs feedback control of a timing of a pulse output signal output from the ring resonator to the first modulator.

5. The laser apparatus according to claim 1, further comprising:
a feedback control unit that performs feedback control of the second modulator with a signal obtained by detecting a pulse output signal output from the ring resonator by an external passive optical resonator.

6. The laser apparatus according to claim 1, further comprising:
a feedback control unit that performs feedback control of the delay amount varying unit by continuously varying the group delay with a signal obtained by detecting a pulse output signal output from the ring resonator by an external passive optical resonator.

7. The laser apparatus according to claim 1, wherein the gain medium, the first modulator, and the second modulator are comprised of the same material.

8. The laser apparatus according to claim 1, wherein the ring resonator includes a shaping unit that passively shapes a spectrum.

9. An optical tomographic imaging apparatus in which light from a light source is split into two light beams, and one of the two light beams is directed to an object to be measured and the other is directed to a reference mirror, and by using interfering light generated by interference between backscattered light of the one light beam reflecting off the object to be measured and reflected light of the other light beam reflecting off the reference mirror, a tomographic image of the object to be measured is taken, wherein the light source is comprised of the laser apparatus according to claim 1.

10. The laser apparatus according to claim 1, wherein the ring resonator further includes an output coupler.

11. The laser apparatus according to claim 1, further comprising means for changing the bandwidth of the spectrum of the output light by changing the amplitude of the periodic modulation.

* * * * *